(12) United States Patent
Chung

(10) Patent No.: US 8,203,695 B2
(45) Date of Patent: Jun. 19, 2012

(54) PHOTOLITHOGRAPHY SYSTEMS AND ASSOCIATED METHODS OF FOCUS CORRECTION

(75) Inventor: Woong Jae Chung, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 673 days.

(21) Appl. No.: 12/264,109

(22) Filed: Nov. 3, 2008

(65) Prior Publication Data

US 2010/0110401 A1    May 6, 2010

(51) Int. Cl.
G03B 27/52 (2006.01)
G03B 27/42 (2006.01)
G03B 27/32 (2006.01)
G03B 27/68 (2006.01)
G03B 27/58 (2006.01)

(52) U.S. Cl. ............... 355/55; 355/52; 355/53; 355/72; 355/77

(58) Field of Classification Search ............ 355/52, 355/53, 55, 61, 62, 72, 75, 77; 702/85, 94; 356/4.03, 4.04, 624; 430/30, 394, 5, 8, 22, 430/311, 312, 321; 250/492.1, 492.2, 492.22, 250/548
See application file for complete search history.

(56) References Cited

U.S. PATENT DOCUMENTS

| | | | | |
|---|---|---|---|---|
| 5,742,067 A * | 4/1998 | Imai | ............................... | 250/548 |
| 5,751,428 A * | 5/1998 | Kataoka et al. | ................ | 356/401 |
| 6,118,515 A * | 9/2000 | Wakamoto et al. | .............. | 355/53 |
| 6,208,748 B1 * | 3/2001 | Troccolo et al. | ............... | 382/100 |
| 6,295,629 B1 * | 9/2001 | Suganaga | ..................... | 716/136 |
| 6,297,877 B1 | 10/2001 | Hickman | | |
| 6,337,217 B1 | 1/2002 | Hause et al. | | |
| 6,426,174 B1 | 7/2002 | Kamiya | | |
| 6,501,534 B1 | 12/2002 | Singh et al. | | |
| 6,519,024 B2 | 2/2003 | Hirano | | |
| 7,119,893 B2 * | 10/2006 | Littau et al. | .................... | 356/124 |
| 7,292,311 B2 * | 11/2007 | Kurosawa | ....................... | 355/53 |
| 2003/0133088 A1 * | 7/2003 | Okita et al. | ..................... | 355/53 |
| 2004/0239905 A1 * | 12/2004 | Van Rhee et al. | ............... | 355/55 |
| 2005/0179880 A1 * | 8/2005 | Butler et al. | .................... | 355/53 |
| 2005/0185170 A1 * | 8/2005 | Lin et al. | .................... | 356/237.1 |
| 2007/0035712 A1 * | 2/2007 | Gassner et al. | ................. | 355/55 |
| 2007/0133864 A1 | 6/2007 | Morimoto | | |
| 2008/0248403 A1 * | 10/2008 | Yu et al. | ............................ | 430/5 |
| 2009/0325087 A1 * | 12/2009 | Lyons | ............................. | 430/30 |
| 2011/0043776 A1 * | 2/2011 | Fujisawa | ......................... | 355/53 |

FOREIGN PATENT DOCUMENTS

KR    20040040964 A    5/2004

* cited by examiner

*Primary Examiner* — Peter B Kim
*Assistant Examiner* — Christina Riddle
(74) *Attorney, Agent, or Firm* — Perkins Coie LLP

(57) ABSTRACT

Several embodiments of photolithography systems and associated methods of focus correction are disclosed herein. In one embodiment, a method for characterizing focus errors in a photolithography system includes placing a microelectronic substrate onto a substrate support of the photolithography system. The microelectronic substrate is divided into a plurality of fields individually partitioned into a plurality of regions. The method also includes developing a raw focus error map that has a focus error corresponding to the individual regions of the plurality of fields and deriving at least one of an inter-field focus error map and an intra-field focus error map based on the raw focus error map. The inter-field focus error map has an inter-field focus error corresponding to the individual fields, and the intra-field focus error map has an intra-field focus error corresponding to the individual regions.

14 Claims, 8 Drawing Sheets

US 8,203,695 B2

PHOTOLITHOGRAPHY SYSTEMS AND ASSOCIATED METHODS OF FOCUS CORRECTION

TECHNICAL FIELD

The present disclosure is related to photolithography devices and associated methods of focus correction.

BACKGROUND

Photolithography is a process commonly used in semiconductor fabrication for selectively removing portions of a thin film from or depositing portions of a film onto discrete areas of a surface of a semiconductor wafer. A typical photolithography process includes spin coating a layer of a light-sensitive material (commonly referred to as a "photoresist") onto the surface of the semiconductor wafer. The semiconductor wafer is then exposed to a pattern of light that chemically modifies a portion of the photoresist incident to the light. The process further includes removing one of the incident portion or the non-incident portion from the surface of the semiconductor wafer with a chemical solution (e.g., a "developer") to form a pattern of openings in the photoresist on the wafer. Subsequently, portions of the thin film on the surface of the semiconductor wafer can be selectively removed from or deposited onto the surface of the wafer through the openings of the photoresist mask.

The size of individual components in semiconductor devices is constantly decreasing in the semiconductor industry. To accommodate the ever smaller components, semiconductor manufacturers and photolithography tool providers have produced higher numerical aperture ("NA") photolithography systems using smaller wavelengths (e.g., 193 nm). The high NA has improved the resolution of the photolithography systems, but this resolution enhancement comes at the expense of the overall focus budget. As a result, the focus and/or exposure control must be very precise to avoid reducing product yields.

DETAILED DESCRIPTION

Various embodiments of photolithography systems for processing microelectronic substrates and associated methods of calibration are described below. The term "microelectronic substrate" is used throughout to include substrates upon which and/or in which microelectronic devices, micromechanical devices, data storage elements, read/write components, and other features are fabricated. Microelectronic substrates can include one or more conductive and/or non-conductive layers (e.g., metallic, semiconductive, and/or dielectric layers) that are situated upon or within one another. These conductive and/or nonconductive layers can also include a wide variety of electrical elements, mechanical elements, and/or systems of such elements in the conductive and/or nonconductive layers (e.g., an integrated circuit, a memory, a processor, a microelectromechanical system, etc.) The term "photoresist" generally refers to a material that can be chemically modified when exposed to electromagnetic radiation. The term encompasses both positive photoresist that is configured to be soluble when activated by the electromagnetic radiation and negative photoresist that is configured to be insoluble when activated by light. A person skilled in the relevant art will also understand that the disclosure may have additional embodiments, and that the disclosure may be practiced without several of the details of the embodiments described below with reference to FIGS. 1-8.

Figure 1:
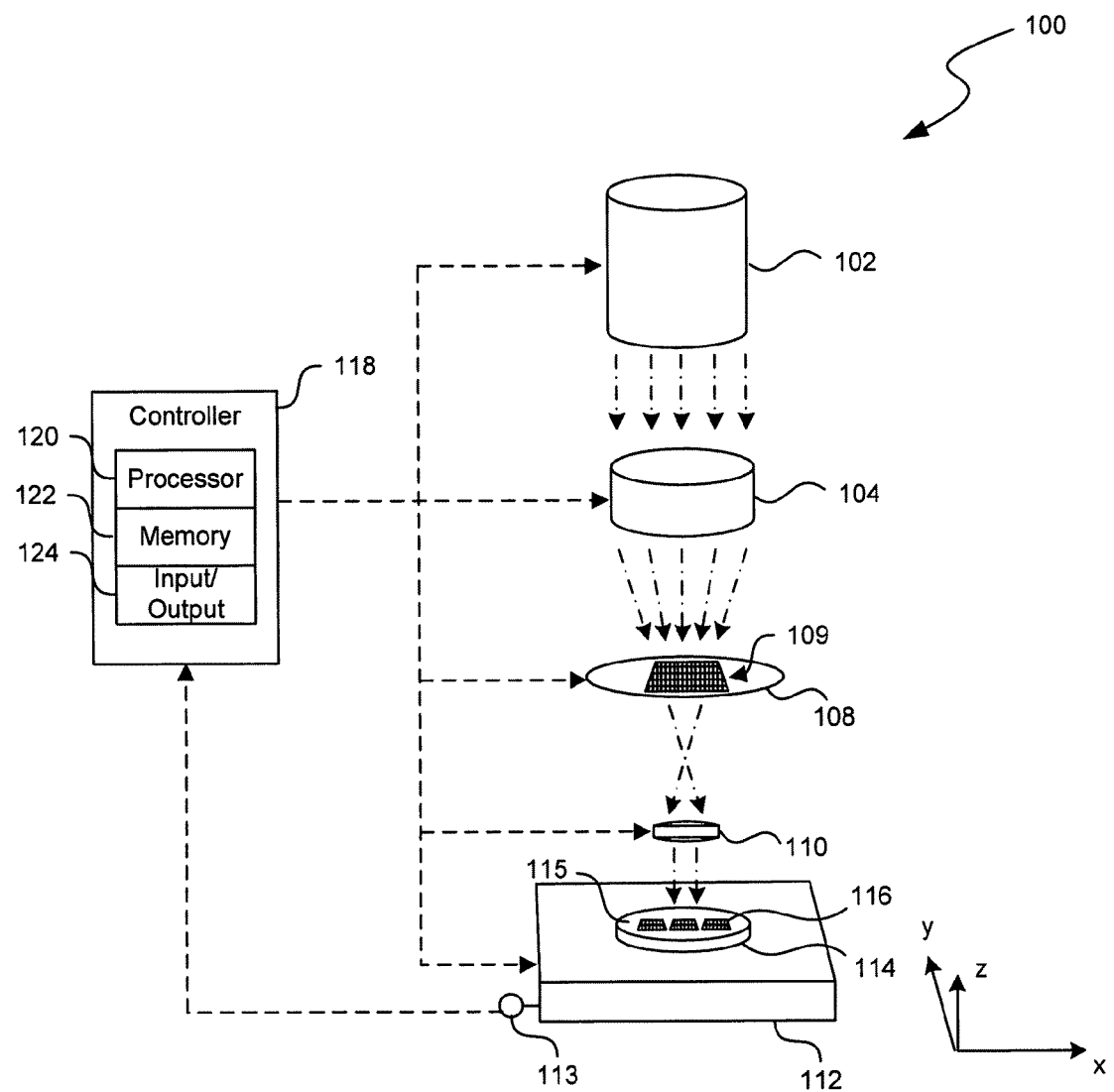
FIG. 1 is a schematic view of a photolithography system configured in accordance with an embodiment of the disclosure.

FIG. 1 is a schematic view of a photolithography system 100 configured in accordance with an embodiment of the disclosure. In the embodiment illustrated in FIG. 1, the photolithography system 100 includes an illumination source 102, a condenser lens 104, a reticle 108, an objective lens 110, and a substrate support 112 arranged in series. A controller 118 is operatively coupled to the various components of the photolithography system 100 for monitoring and/or controlling the operation of these components. In other embodiments, the photolithography system 100 can also include a substrate transport station, a structural support (e.g., a reticle support, a lens support, etc.), position sensors (e.g., a scatterometer), an immersion hood, a support actuator (e.g., an electric motor), and/or other suitable mechanical and/or electrical components.

The illumination source 102 can include an ultraviolet light source (e.g., a fluorescent lamp), a laser source (e.g., an argon fluoride excimer laser), and/or other suitable electromagnetic emission sources. The illumination source 102 can also include lenses, collimators, mirrors, and/or other suitable conditioning components (not shown). In certain embodiments, the illumination source 102 can be configured to produce a generally coherent illumination at a single frequency. In other embodiments, the illumination source 102 can also be at least partially incoherent. In further embodiments, the illumination source 102 can also be configured to generate illumination at multiple frequencies.

The condenser lens 104 can be configured to concentrate the illumination from the illumination source 102 onto the reticle 108. In certain embodiments, the condenser lens 104 can include a plurality of reflective and/or refractive lenses arranged in series. In other embodiments, the condenser lens 104 can also include collimators, mirrors, and/or other suitable illumination conditioning components. The photolithography system can also include actuators (e.g., electric motors) configured to move the condenser lens 104 relative to the illumination source 102 and/or the reticle 108 based on instructions from the controller 118.

The reticle 108 can include an opaque plate with lines, apertures, and/or transparencies that allow the illumination from the illumination source 102 to pass through in a defined pattern 109. In the illustrated embodiment, the pattern 109 includes a grating. In other embodiments, the pattern 109 can also include a collection of lines, channels, apertures, shapes, and/or other geometric elements in a suitable arrangement. In further embodiments, the reticle 108 can also include layers of material with different refraction index values and/or other suitable phase-shifting components (not shown). As a result, the reticle 108 can achieve a desired phase shift (e.g., 180°) between illumination transmitted through the pattern 109 and illumination that is transmitted through another area of the reticle 108. In certain embodiments, the phase shift may be used to detect focus errors on various locations of a microelectronic substrate 114.

The objective lens 110 can be configured to project the illumination from the reticle 108 onto the photoresist 115 of the microelectronic substrate 114. As shown in FIG. 1, the photoresist 115 of the microelectronic substrate 114 can be divided into discrete areas (hereinafter referred to as "fields 116"). During exposure, the pattern 109 from the reticle 108 can be replicated or printed individually onto one of the fields 116. Even though the fields 116 are shown in FIG. 1 as spaced apart from one another, in other embodiments, adjacent fields 116 can be abutting one another, as described in more detail below with reference to FIGS. 2A and 2B, or the fields 116 can have other suitable arrangements relative to one another.

The substrate support 112 can be configured to carry the microelectronic substrate 114. The substrate support 112 can include a vacuum chuck, a mechanical chuck, and/or other suitable supporting device. In the illustrated embodiment, the photolithography system 100 includes at least one actuator (not shown) configured to move the substrate support 112 laterally (as indicated by the X-axis), transversely (as indicated by the Y-axis), and/or vertically (as indicated by the Z-axis) relative to the reticle 108 and/or other components of the photolithography system 100. In certain embodiments, the substrate support 112 can also include a position transmitter 113 configured to monitor the position of the substrate support 112 along the X-axis, Y-axis, and/or the Z-axis. Even though only one substrate support 112 is shown in FIG. 1, in certain embodiments, the photolithography system 100 can include two, three, or any desired number of substrate supports with structures and/or functions that are generally similar to or different than the substrate support 112.

The controller 118 can include a processor 120 coupled to a memory 122 and an input/output component 124. The processor 120 can include a microprocessor, a field-programmable gate array, and/or other suitable logic devices. The memory 122 can include volatile and/or nonvolatile media (e.g., ROM; RAM, magnetic disk storage media; optical storage media; flash memory devices, and/or other suitable storage media) and/or other types of computer-readable storage media configured to store data received from, as well as instructions for, the processor 120. The input/output component 124 can include a display, a touch screen, a keyboard, a mouse, and/or other suitable types of input/output devices configured to accept input from and provide output to an operator.

In certain embodiments, the controller 118 can include a personal computer operatively coupled to the other components of the photolithography system 100 via a communication link (e.g., a USB link, an Ethernet link, a Bluetooth link, etc.) In other embodiments, the controller 118 can include a network server operatively coupled to the other components of the photolithography system 100 via a network connection (e.g., an internet connection, an intranet connection, etc.) In further embodiments, the controller 118 can include a process logic controller, a distributed control system, and/or other suitable computing frameworks.

In operation, the photolithography system 100 can first receive a batch of microelectronic substrates 114 in a substrate transport station (not shown) and/or other suitable substrate holding device. The batch can include any desired number of microelectronic substrates 114, such as 12 or 24. A first microelectronic substrate 114 is loaded onto the substrate support 112, and the photolithography system 100 exposes individual fields 116 of the first microelectronic substrate 114 to the illumination source 102 to print a copy of the pattern 109 in the individual fields 116.

In certain embodiments, the photolithography system 100 can expose the individual fields 116 of the microelectronic substrate 114 in a step mode. For example, the controller 118 can energize the actuator(s) to move the substrate support 112 a discrete distance (commonly referred to as a "step") along the X-axis or the Y-axis. Once the field 116 is in position, the illumination source 102 illuminates the incident field 116 through the reticle 108 for a preselected period of time. The illumination is then turned off, and the controller 118 energizes the actuator(s) to move the substrate support 112 another step along either the X-axis or the Y-axis. A subsequent field 116 is exposed in a similar fashion, and this process is repeated until all of the fields 116 are exposed.

In other embodiments, the controller 118 can operate the photolithography system 100 in a scanning mode. For example, the controller 118 can control the actuators to move the substrate support 112 continuously along the X-axis or the Y-axis at a preselected speed in a first direction or a second direction opposite the first direction. As the fields 116 move along the X-axis or the Y-axis, the illumination source 102 illuminates the photoresist 115 on the microelectronic substrate 114 to print a copy of the pattern 109 in the individual fields 116. In further embodiments, the controller 118 can cause the photolithography system 100 to operate in a combination of the step mode and scanning mode.

After all the fields 116 on the first microelectronic substrate 114 are exposed, the first microelectronic substrate 114 can be removed from the substrate support 112 and can undergo photoresist developing, baking, cleaning, and/or other suitable processing. A second microelectronic substrate 114 can then be loaded onto the substrate support 112 from the batch, and the foregoing exposure procedures can be repeated until at least some of the microelectronic substrates 114 in the batch are processed.

One operational difficulty with conventional implementations of the foregoing technique is that the photolithography system 100 may not adequately correct for focus errors when exposing different fields 116 and/or scanning fields 116 in different directions. According to conventional techniques, a focus offset is typically applied to address the particularities of the substrate support 112. For example, the controller 118 can cause the substrate support 112 to be offset along the Z-axis for a preselected value (e.g., 30 nm) when processing the microelectronic substrates 114 in the batch. The inventor has recognized that such a technique may be helpful in reducing the focus errors induced by the substrate support 112, but it does not account for several other factors that may also influence the focus errors. Without being bound by theory, it is believed that topographical differences in individual fields 116, the warping of the microelectronic substrate 114, and/or tilting of the microelectronic substrate 114 along the X-axis or the Y-axis can also impact the focus errors encountered in the photolithography system 100.

Several embodiments of the photolithography system 100 can address the foregoing operation difficulty by applying at least one of an inter-field offset and an intra-field offset to the individual fields 116 of the microelectronic substrate 114 during exposure. Simulation results of the microelectronic substrate 114 processed according to several embodiments of the photolithography system 100 are schematically illustrated in FIGS. 2A-5D. However, other embodiments of the photolithography system 100 can be configured to perform other processing stages in addition to or in lieu of those described below.

Figure 2B:
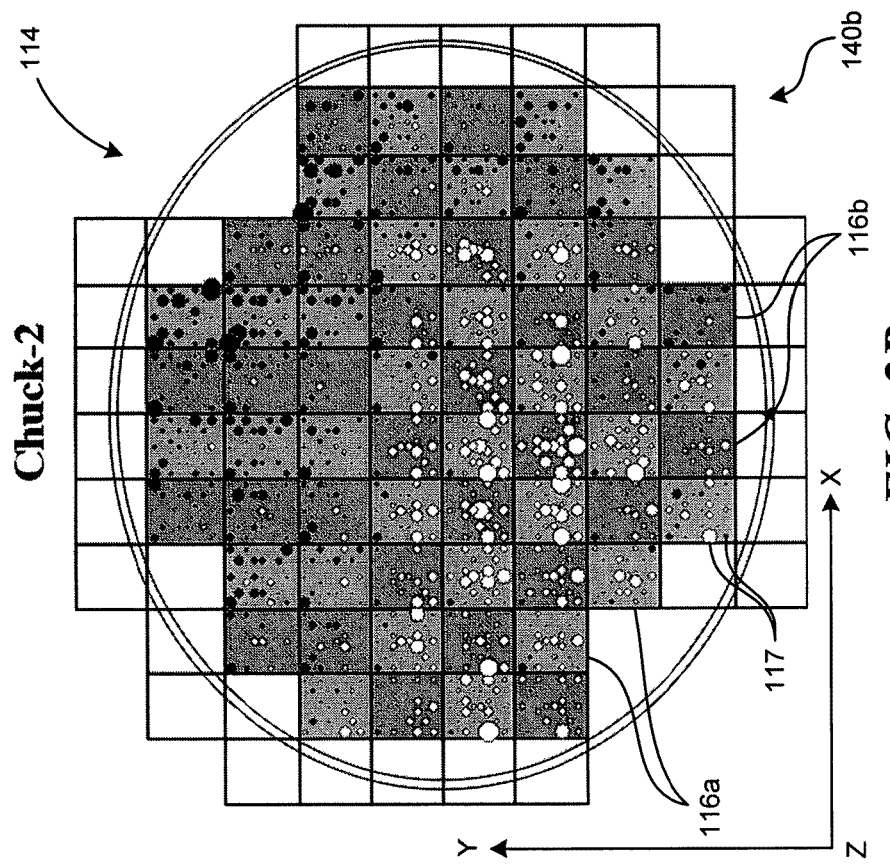
FIGS. 2A and 2B are schematic top views individually illustrating a raw focus error map of a microelectronic substrate in accordance with embodiments of the disclosure.
Figure 2A:
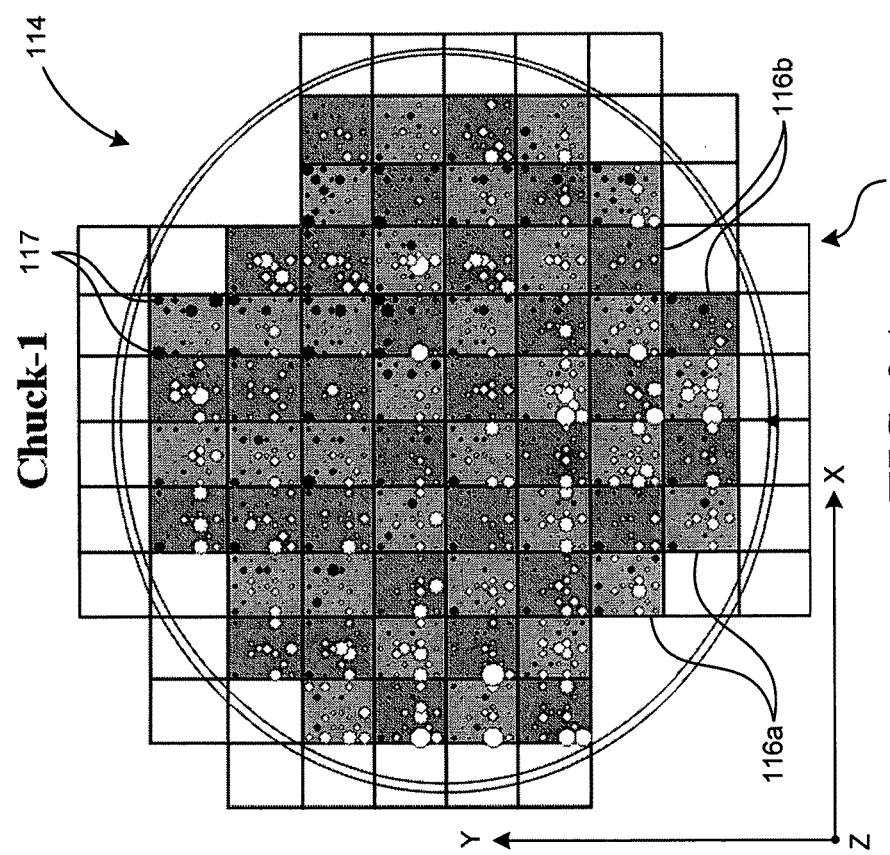

During an initial processing stage, an operator can develop a focus error map (hereinafter referred to as the "raw map") of the microelectronic substrate 114 by using phase-shift reticles, scatterometry, and/or other suitable techniques. FIGS. 2A and 2B are schematic top views showing examples of raw maps 140a and 140b of the microelectronic substrate 114 when carried by two different substrate supports 112 (referred to as "Chuck-1", and "Chuck-2"), respectively. As shown in FIGS. 2A and 2B, the fields 116 can be subdivided into first scanning fields 116a and second scanning fields 116b. The first scanning fields 116a can be scanned in a first direction along the X-axis or the Y-axis, and the second scanning fields 116b can be scanned in a second direction opposite the first direction along the X-axis or the Y-axis. In other embodiments, the fields 116 can also be subdivided to have other arrangements.

As shown in FIGS. 2A and 2B, the individual fields 116 can be partitioned into a plurality of regions 117 (e.g., 24 regions) arranged generally in an array. In certain embodiments, the regions 117 can be represented by an X-coordinate and a Y-coordinate from a preselected reference point (e.g., the center of the microelectronic substrate 114) and/or by a unique region number. In other embodiments, the regions 117 can be represented by sequence numbers, alphabetic numbers, alpha-numerical numbers, and/or other suitable representations.

The operator can then determine a focus error (e.g., expressed as an offset along the Z-axis) for at least some of the regions 117 of the individual fields 116 and store the focus errors as records of the raw maps in an array as follows:

$$E_{(x,y)} = (x, y, \Delta z)$$

In FIGS. 2A-4B, the focus errors for the individual regions 117 are schematically represented as circles. The area of the individual circles represents the magnitude of the focus error, and the color of the individual circles represents the direction of the focus error along the Z-axis relative to a reference direction.

The operator can then develop an inter-field map based on the raw maps 140a and 140b of FIGS. 2A and 2B. An inter-field map generally refers to a set of records individually containing a focus error (hereinafter referred to as the "inter-field error") corresponding to the individual fields 116 on the microelectronic substrate 114. As a result, one of the fields 116 would have a corresponding record in the inter-field map that contains an inter-field error for the field 116.

In certain embodiments, the inter-field error for a particular field 116 can be represented as a Z-axis offset (Inter_E$_{(x,y)}$) and can be calculated as follows:

$$\text{Inter\_E}_{(x,y)} = \frac{\sum \Delta z_i}{n}$$

where n is the number of the regions 117 and $\Delta z_i$ is the determined focus error along the Z-axis for one of the regions 117 in the particular field 116. In other embodiments, the inter-field error can also be calculated as a median value, a geometric median value, a harmonic mean, a quadratic mean, a weighted mean (e.g., based on positions on the microelectronic substrate 114), and/or other suitable combination of the determined focus errors.

Figure 3B:
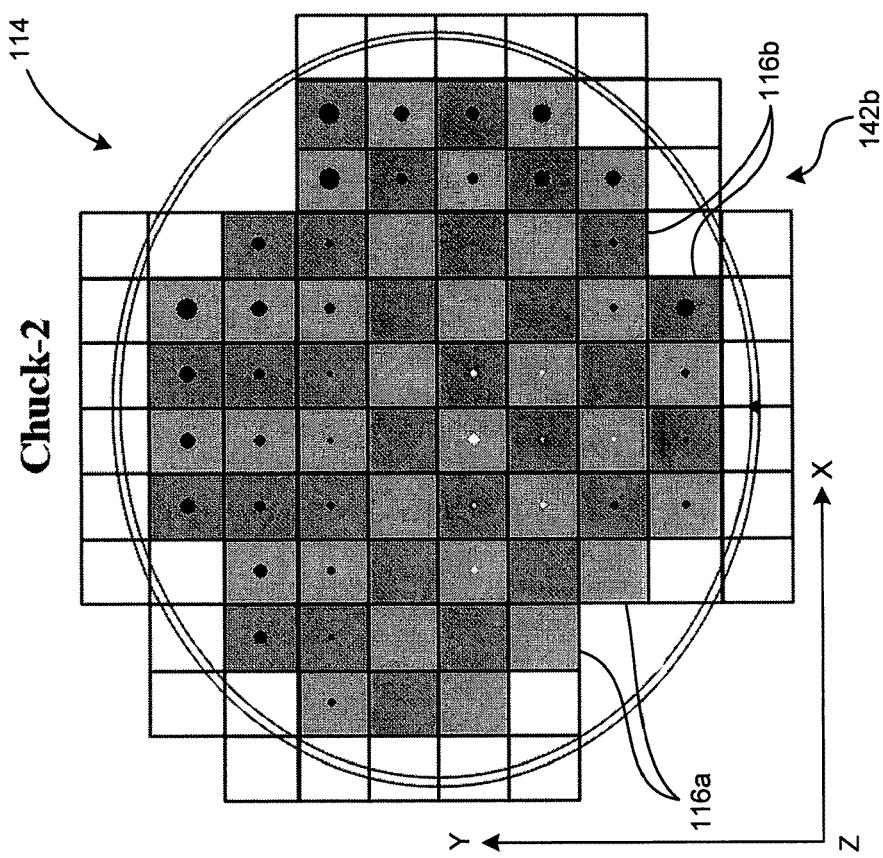
FIGS. 3A and 3B are schematic top views individually illustrating an inter-field focus error map in accordance with embodiments of the disclosure.
Figure 3A:
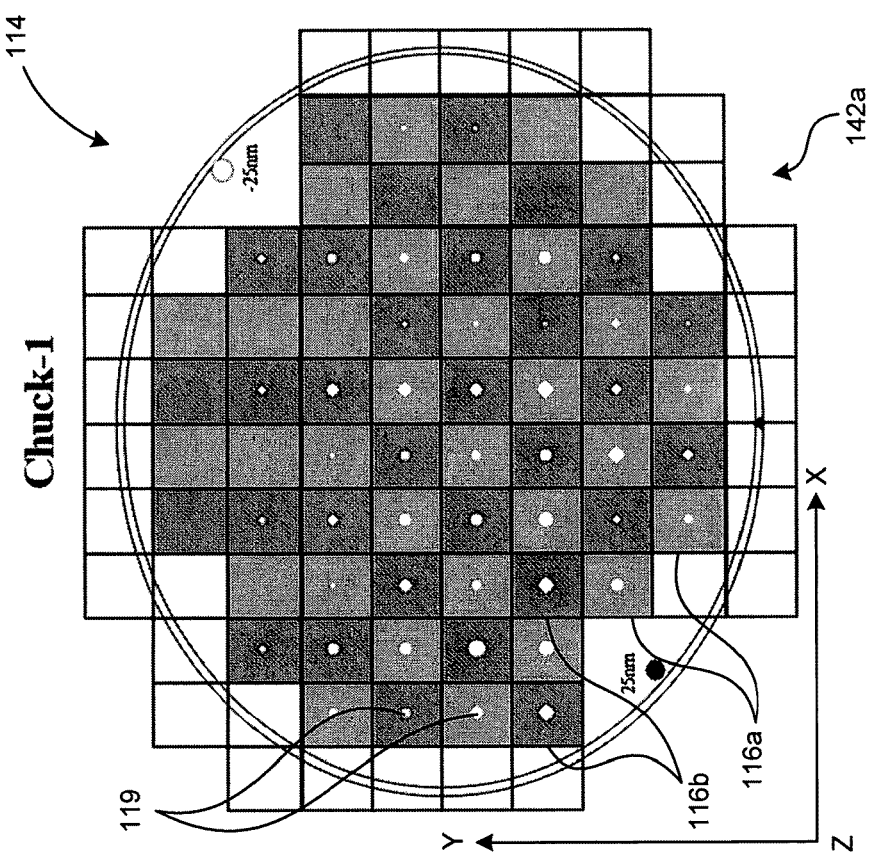

FIGS. 3A and 3B schematically illustrate examples of inter-field maps 142a and 142b derived from the raw maps in FIGS. 2A and 2B for Chuck-1 and Chuck-2, respectively. As shown in FIGS. 3A and 3B, the individual fields 116 include an inter-field error 119, which can vary along the X-axis and/or the Y-axis. Without being bound by theory, it is believed that the variation in the inter-field error 119 is related to the warpage of the microelectronic substrate 114. As a result, by correcting the focus based on the inter-field error 119, the impact of the warpage can be at least reduced.

The operator can also develop an intra-field map based on the raw maps 140a and 140b of FIGS. 2A and 2B for Chuck-1 and Chuck-2, respectively. An intra-field map generally refers to a set of records individually containing an intra-field focus error (hereinafter referred to as the "intra-field error") corresponding to the individual regions 117 for the microelectronic substrate 114. As a result, the individual regions 117 can include a corresponding intra-field error for at least some of the fields 116 of the microelectronic substrate 114.

In certain embodiments, the intra-field offset for a particular region 117 can be represented as a Z-axis offset (Intra_E$_i$) and calculated as follows:

$$\text{Intra\_E}_i = \frac{\sum \Delta z_i}{m}$$

where m is a number of at least some of the fields 116 on the microelectronic substrate 114 and $\Delta z_i$ is the determined focus error along the Z-axis in one of the fields 116 for the particular region 117. In other embodiments, the intra-field offset can also be calculated as a median value, a geometric median value, a harmonic mean, a quadratic mean, a weighted mean (e.g., based on scanning directions and/or positions of the fields 116 on the microelectronic substrate 114), and/or other suitable combination of the determined focus errors.

Figure 4A:
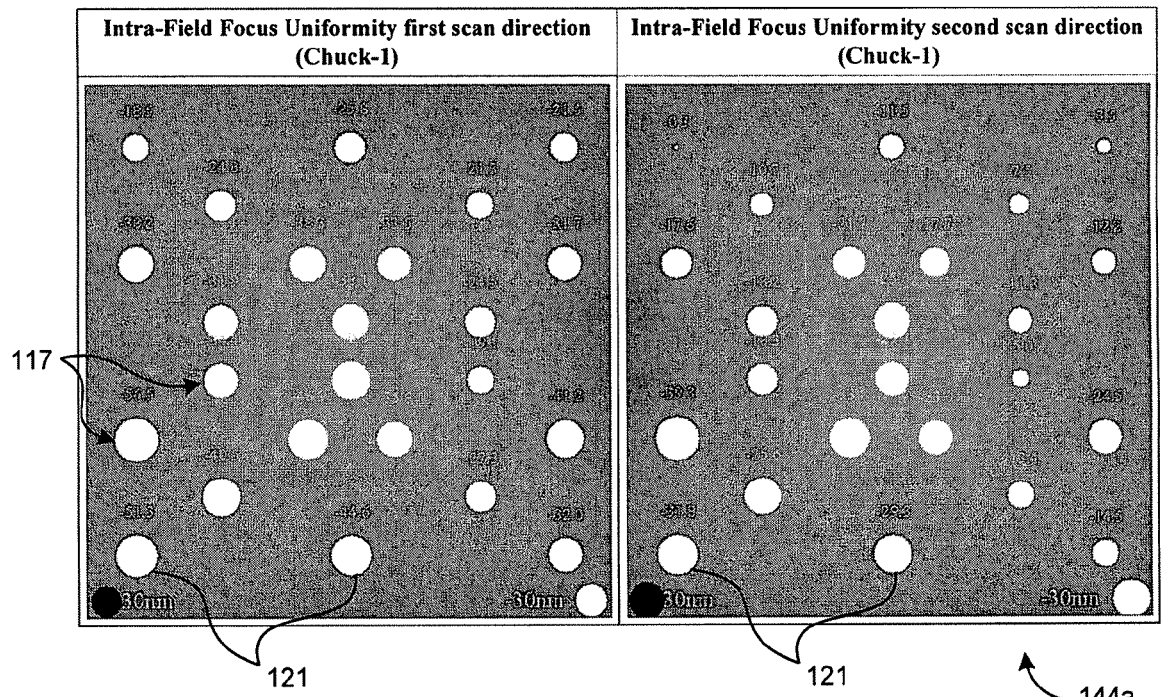
FIGS. 4A and 4B are schematic top views individually illustrating an intra-field focus error map in accordance with embodiments of the disclosure.
Figure 4B:
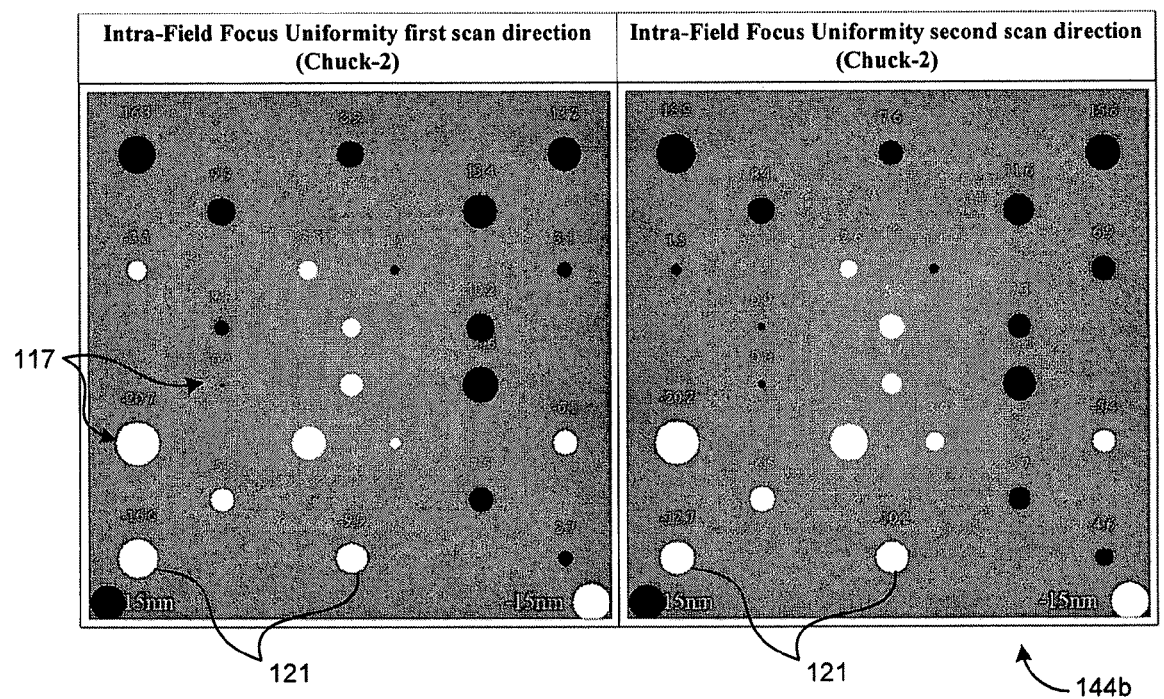

FIGS. 4A and 4B schematically illustrate examples of intra-field maps 144a and 144b derived from the raw maps in FIGS. 2A and 2B for Chuck-1 and Chuck-2, respectively. As shown in FIGS. 4A and 4B, the individual intra-field maps 144a and 144b include a plurality of intra-field errors 121 individually corresponding to the regions 117. For a particular region 117, the corresponding intra-field error 121 may have different values corresponding to different scanning directions. Without being bound by theory, it is believed that the variation in the intra-field error 121 is related to the tilt of the microelectronic substrate 114 along the X-axis and/or the Y-axis. As a result, by correcting the focus based on the intra-field error 121, the impact of the tilt can be at least reduced.

Figure 5A:
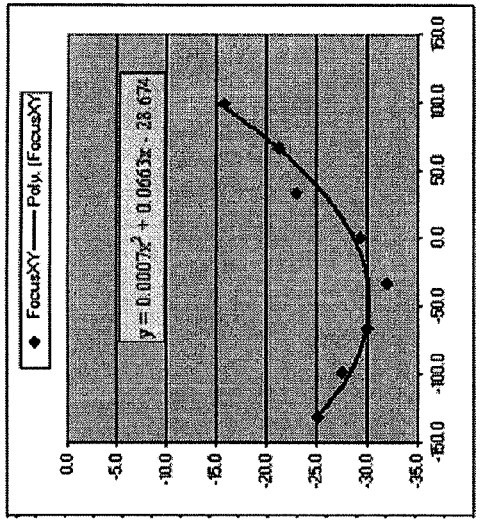
FIGS. 5A and 5B are focus error versus location charts illustrating inter-field focus errors of a microelectronic substrate in accordance with embodiments of the disclosure.
Figure 5B:
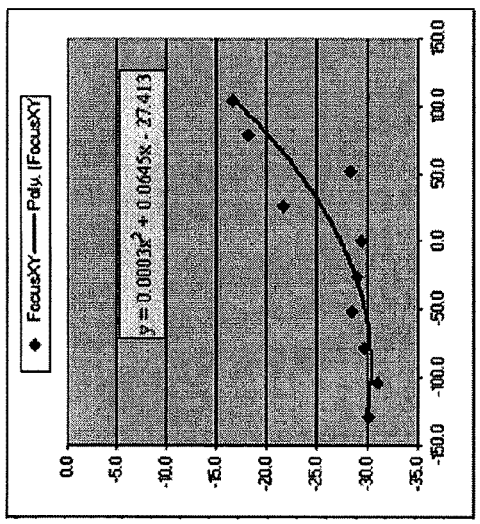
Figure 5C:
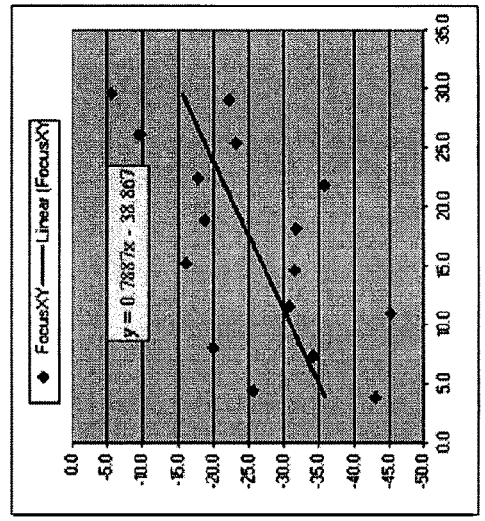
FIGS. 5C and 5D are focus error versus location charts illustrating intra-field focus errors of a microelectronic substrate in accordance with embodiments of the disclosure.
Figure 5D:
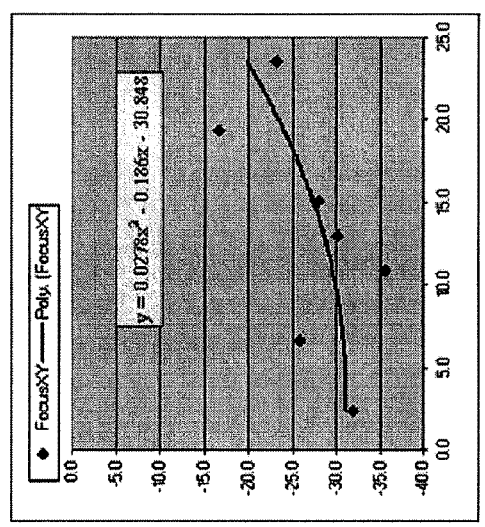

After deriving the inter-field and the intra-field maps 142a, 142b, 144a, and 144b, mathematical models that describe the inter-field and/or the intra-field maps are developed. In certain embodiments, the inter-field and/or the intra-field maps may be captured in polynomials of a first order, a second order, a third order, and/or other desired orders. For example, FIGS. 5A-D are focus error versus location charts illustrating regression of inter-field and intra-field errors from FIGS. 3A-4B. In these examples, second order polynomials are shown in FIGS. 5A-C, and a first order polynomial is shown in FIG. 5D. By performing regression of the inter-field and intra-field errors for Chuck-1 from FIGS. 3A-4B, the following polynomials describing the inter-field and intra-field maps can be obtained:

| FIG. 5A | Inter-field offset X-axis | $y = 0.0003x^2 + 0.0645x - 27.413$ |
| FIG. 5B | Inter-field offset Y-axis | $y = 0.0007x^2 + 0.0663x - 28.674$ |
| FIG. 5C | Intra-field offset X-axis | $y = 0.0278x^2 - 0.186x - 30.848$ |
| FIG. 5D | Intra-field offset Y-axis | $y = 0.7887x - 38.867$ |

In other embodiments, the inter-field and/or the intra-field maps may be captured in exponential functions, logarithmic functions, sinusoidal functions, and/or other suitable mathematical representations.

The operator can then apply the inter-field and/or the intra-field maps to improve focus tolerance in the photolithography system 100. Referring back to FIG. 1, after receiving a position indicator from the position transmitter 113, the controller 118 determines which particular field 116 is to be processed. Then, the controller 118 can apply an inter-field offset for the field 116 and/or apply intra-field offsets for individual regions of the field 116 based on the position indicated. For example, applying the inter-field offset can include calculating at least one of an inter-field offset and an intra-field offset based on the mathematical models discussed above. The controller 118 causes the substrate support 112 to move along the Z-axis for a distance according to the inter-field offset and/or the intra-field offset.

Several embodiments of the photolithography system 100 can also periodically update the inter-field and/or the intra-field maps as the photolithography system 100 processes the batch of microelectronic substrates 114. For example, in certain embodiments, a raw map may be determined for each of the microelectronic substrates 114 in the batch before exposure, and the inter-field and/or the intra-field map may be reassimilated or redeveloped based on each of the raw maps. In other embodiments, a raw map may be determined for every other microelectronic substrates 114 in the batch. In further embodiments, updating the inter-field and/or the intra-field map may be omitted.

The inventor has recognized that applying the foregoing techniques can reduce the variance of the focus errors for the microelectronic substrate 114 and thus improve product yields. In particular, the inventor has recognized that correcting the focus error based on the inter-field map can at least reduce the impact of substrate warping on the focus errors. The inventor has also recognized that correcting the focus error based on the intra-field map can at least reduce the impact of substrate tilting along the X-axis and/or the Y-axis. In one particular implementation of the foregoing technique, the inventor observed a decrease in focus error variance in the X-axis direction by about 18% and in the Y-axis direction by about 9%.

Even though the photolithography system 100 is described above as correcting focus errors by applying Z-axis offsets, in other embodiments, the photolithography system 100 can also correct focus errors by tilting, shifting, and/or otherwise spatially adjusting the illumination source 102, the condenser lens 104, the reticle 108, the objective lens 110, and/or the substrate support 112. In further embodiments, the temperature or the thickness of the microelectronic substrate 114 and/or other factors may also be used to correct for substrate warpage and/or substrate tilting along the X-axis and/or the Y-axis.

Figure 6:
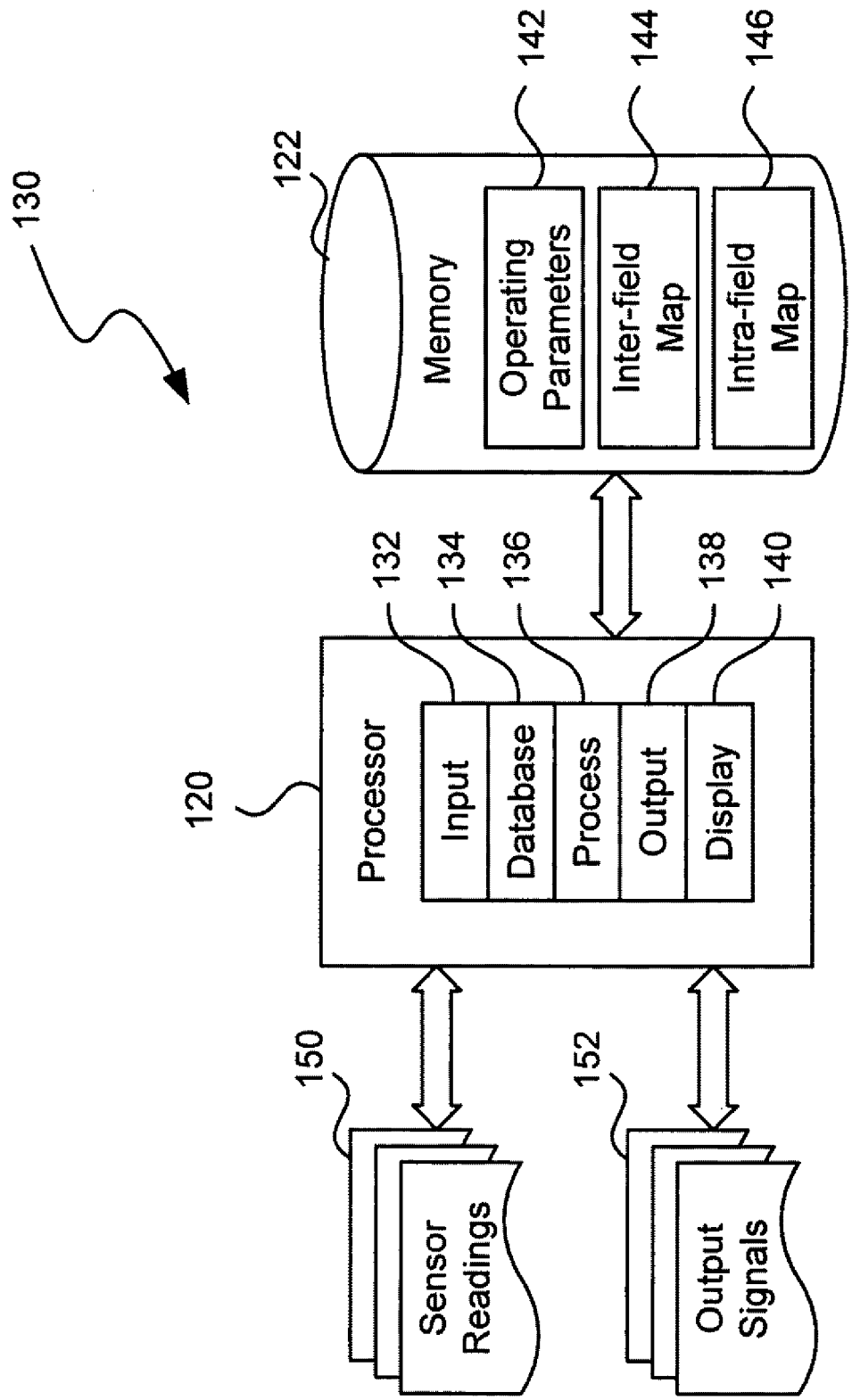
FIG. 6 is a block diagram showing computing system software modules suitable for the photolithography system of FIG. 1 in accordance with embodiments of the disclosure.

FIG. 6 is a block diagram showing computing system software modules 130 suitable for the controller 118 of FIG. 1 in accordance with embodiments of the disclosure. Each component may be a computer program, procedure, or process written as source code in a conventional programming language, such as the C++ programming language, and may be presented for execution by the processor 120 (FIG. 1) of the controller 118. The various implementations of the source code and object byte codes may be stored in the memory 122 (FIG. 1). The software modules 130 of the controller 118 may include an input module 132, a database module 134, a process module 136, an output module 138, and, optionally, a display module 140 interconnected with one another.

In operation, the input module 132 accepts an operator input, such as process setpoint (e.g., the Z-axis offset for the substrate support 112) and control selections (e.g., selection for step mode or scanning mode), and communicates the accepted information or selections to other components for further processing. The database module 134 organizes records, including operating parameters 142, an inter-field map 144, and an intra-field map 146, and facilitates storing and retrieving of these records to and from the memory 122. The inter-field map 144 and intra-field map 146 may include measured and/or derived focus errors for locations on the microelectronic substrate 114, as described in more detail below with reference to FIGS. 7 and 8. Any type of database organization may be utilized, including a flat file system, hierarchical database, relational database, or distributed database, such as provided by a database vendor such as the Oracle Corporation, Redwood Shores, Calif.

The process module 136 generates control variables based on sensor readings 150 from sensors (e.g., the position sensor 113 of the substrate support 112 in FIG. 1) and/or other data sources, and the output module 138 generates output signals 152 based on the control variables. The processor 120 optionally may include the display module 140 for displaying, printing, or downloading the sensor readings 150, the output signals 152, and/or other information via a monitor, a printer, and/or other suitable devices.

Figure 7:
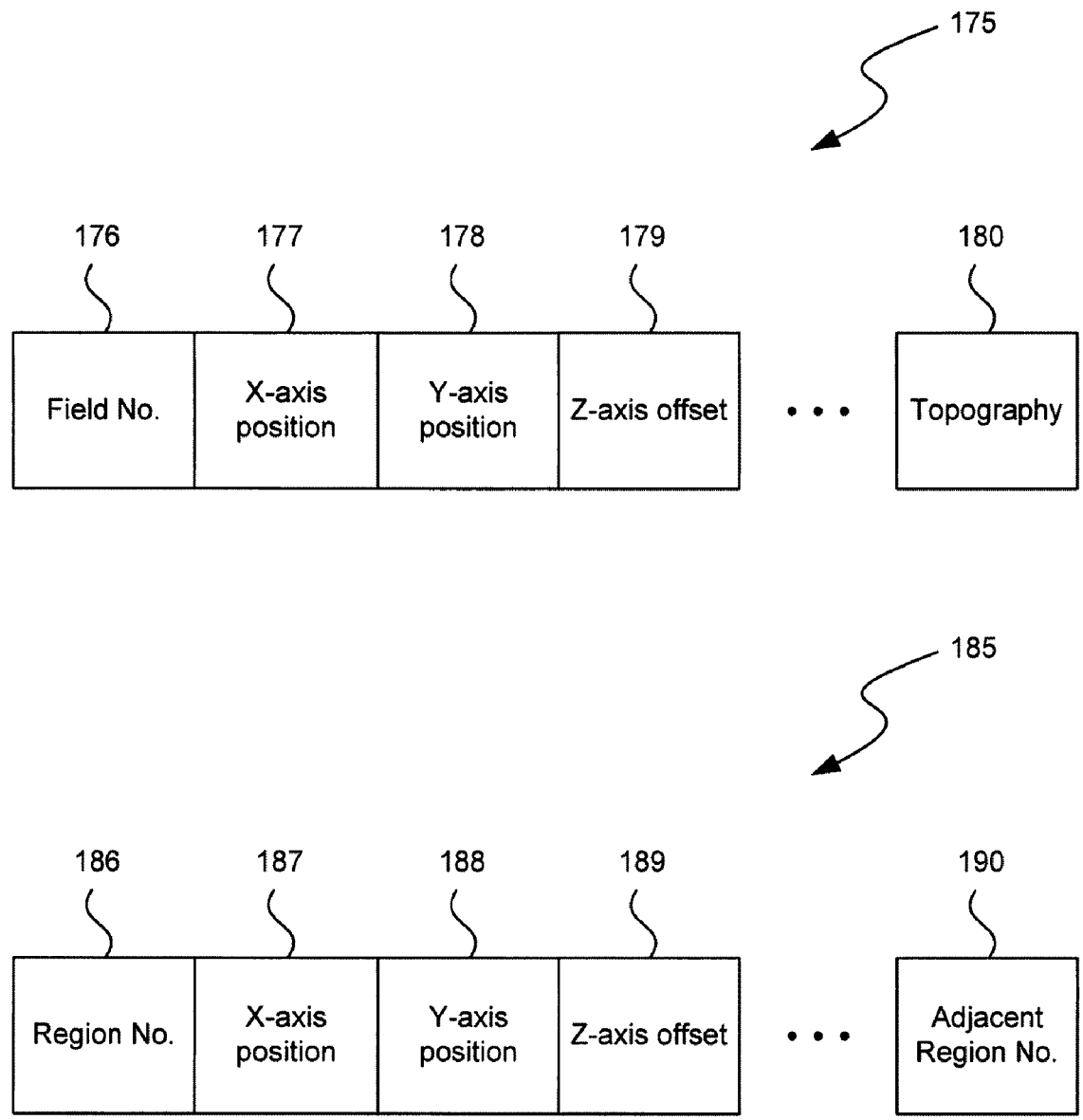
FIG. 7 is a database schema illustrating an organization of an inter-field map and an intra-field map in accordance with embodiments of the disclosure.

FIG. 7 is a database schema illustrating an organization of an inter-field record 175 stored as a part of the inter-field map 144 in the memory 122 of the controller 118 in FIG. 1 and an intra-field record 185 stored as part of the intra-field map 146 in the memory 122 of the controller 118. In the illustrated embodiment, only the information pertaining to the set of focus error measurements in the inter-field map are shown for purpose of clarity. For example, as shown in FIG. 4, the inter-field record 175 can include the following information: a field number 176, an X-axis position 177, a Y-axis position 178, a Z-axis offset 179, and a topography 180. An intra-field record 185 can include a region number 186, an X-axis position 187, a Y-axis position 188, a Z-axis offset 189, and an adjacent region number 190. In other embodiments, the inter-field record 175 and/or the intra-field record 185 can also include historical data and/or other pertinent data (not shown).

Figure 8:
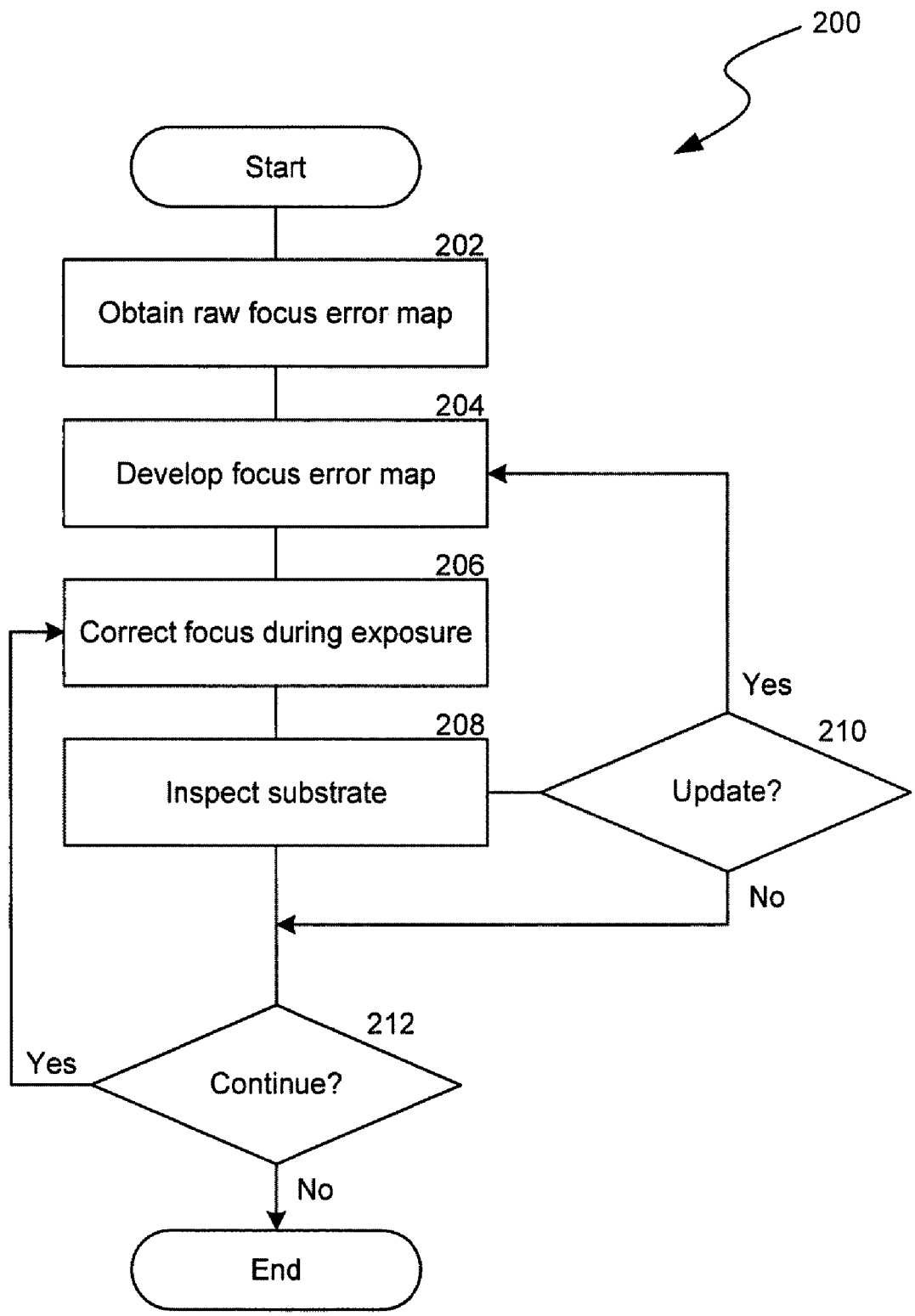
FIG. 8 is a flowchart showing a method for processing a microelectronic substrate in a photolithography system in accordance with embodiments of the disclosure.

FIG. 8 is a flowchart showing a method 200 for processing a microelectronic substrate in a photolithography system in accordance with embodiments of the disclosure. As shown in FIG. 8, the method 200 includes obtaining a raw focus error map at stage 202. In one embodiment, obtaining the raw focus error map can include determining a Z-axis offset for individual regions of each field on a microelectronic substrate. In other embodiments, obtaining the raw focus error map can also include determining the lens draft, the irregularity of the reticle 108 (FIG. 1), and/or other parameters.

The method 200 can include developing at least one focus error map at stage 204. In one embodiment, developing at least one focus error map can include deriving an inter-field map and/or an intra-field map based on the raw focus error map, as described above with reference to FIGS. 3A-4B. In other embodiments, developing at least one focus error map can also include deriving a linear, second order, and/or other suitable order polynomial to describe the inter-field map and/or the intra-field map. Suitable techniques for deriving the polynomial can include linear regression, interpolation, and/or other suitable modeling techniques.

The method 200 can also include correcting the focus errors before or during the exposure of a field based on information from the developed focus error maps of stage 206. In one embodiment, the focus error is corrected based on one of the inter-field and intra-field maps. In another embodiment, the focus error is corrected based on both the inter-field and intra-field maps. In a further embodiment, the focus error is corrected based on both the inter-field and intra-field maps and an overall focus offset for the substrate support.

Optionally, the method 200 can include inspecting the microelectronic substrate after all fields are exposed at stage 208. A decision is made at stage 210 to determine whether the focus error maps should be updated. In one embodiment, if the inspection indicates that the focus errors are above a threshold, then at least one of the focus error maps can be updated, and the process reverts to developing the focus error maps at stage 204. If the inspection indicates that the focus errors are below the threshold, the method 200 continues to another decision stage 212 to determine whether the process should continue. If yes, the process reverts to correcting the focus errors at stage 206; otherwise, the process ends.

From the foregoing, it will be appreciated that specific embodiments of the disclosure have been described herein for purposes of illustration, but that various modifications may be made without deviating from the disclosure. For example, many of the elements of one embodiment may be combined with other embodiments in addition to or in lieu of the elements of the other embodiments. Accordingly, the disclosure is not limited except as by the appended claims.

I claim:

1. A method for characterizing focus errors in a photolithography system, the method comprising:
    placing a microelectronic substrate onto a substrate support of the photolithography system, the microelectronic substrate being divided into a plurality of fields individually partitioned into a plurality of regions;
    developing a raw focus error map for the microelectronic substrate on the substrate support, the raw focus error map having a focus error corresponding to the individual regions of the plurality of fields;
    deriving at least one of an inter-field focus error map and an intra-field focus error map based on the raw focus error map, the inter-field focus error map having an inter-field focus error corresponding to the individual fields and the intra-field focus error map having an intra-field focus error corresponding to the individual regions;
    determining a scanning direction of the individual fields; and
    wherein deriving at least one of an inter-field focus error map and an intra-field focus error map includes:
    deriving the inter-field focus error map by
        calculating a first inter-field arithmetic mean of the focus errors of the plurality of regions in a first field;
        calculating a second inter-field arithmetic mean of the focus errors of the plurality of regions in a second field; and
        developing an inter-field polynomial describing a relationship between the first and second inter-field arithmetic means; and
    deriving the intra-field focus error map by
        calculating a first intra-field arithmetic mean of the focus errors corresponding to a first subset of the fields for a first region, the first subset being scanned in a first direction;
        calculating a second intra-field arithmetic mean of the focus errors corresponding to the first subset of the fields for a second region;
        developing a first intra-field polynomial describing a relationship between the first and second intra-field arithmetic means;
        calculating a third intra-field arithmetic mean of the focus errors corresponding to a second subset of the fields for the first region, the second subset being scanned in a second direction opposite the first direction;
        calculating a fourth intra-field arithmetic mean of the focus errors corresponding to the second subset of the fields for the second region; and
        developing a second intra-field polynomial describing a relationship between the third and fourth intra-field arithmetic means.

2. A method for characterizing focus errors in a photolithography system, the method comprising:
    placing a microelectronic substrate onto a substrate support of the photolithography system, the microelectronic substrate being divided into a plurality of fields individually partitioned into a plurality of regions;
    developing a raw focus error map for the microelectronic substrate on the substrate support, the raw focus error map having a focus error corresponding to the individual regions of the plurality of fields;
    deriving at least one of an inter-field focus error map and an intra-field focus error map based on the raw focus error map, the inter-field focus error map having an inter-field focus error corresponding to the individual fields and the intra-field focus error map having and intra-field focus error corresponding to the individual regions;
    determining the scanning direction of the individual fields; and
    wherein deriving at least one of an inter-field focus error map and an intra-field focus error map includes deriving a first intra-field focus error map by
        calculating at least one of an arithmetic mean, a median value, a geometric median value, a harmonic mean, a quadratic mean, and a weighted mean of the focus errors of a particular region in individual fields for a first subset of the fields, the first subset being scanned in a first scanning direction; and
        calculating at least one of an arithmetic mean, a median value, a geometric median value, a harmonic mean, a quadratic mean, and a weighted mean of the focus errors of the particular region in individual fields for a second subset of the fields, the second subset being scanned in a second scanning direction opposite the first scanning direction.

3. The method of claim 2 wherein deriving at least one of an inter-field focus error map and an intra-field focus error map includes deriving the inter-field focus error map by calculating at least one of an arithmetic mean, a median value, a geometric median value, a harmonic mean, a quadratic mean, and a weighted mean of the focus errors corresponding to at least some of the regions in the individual fields.

4. The method of claim 2 wherein deriving at least one of an inter-field focus error map and an intra-field focus error map includes deriving the inter-field focus error map by calculating the inter-field focus error (Inter_$E_{(x,y)}$) corresponding to a location (x,y) on the microelectronic substrate as follows:

$$\text{Inter\_E}_{(x,y)} = \frac{\sum \Delta z_i}{n}$$

where n is the number of regions in a particular field of the plurality of fields, and $\Delta z_i$ is the focus error for the individual regions in the particular field.

5. The method of claim 2 wherein deriving at least one of an inter-field focus error map and an intra-field focus error map includes deriving the intra-field focus error map by calculating the intra-field focus error (Intra_$E_i$) corresponding to a particular one of the regions located at (x,y) as follows:

$$\text{Intra\_E}_i = \frac{\sum \Delta z_i}{m}$$

where m is a number of the fields, and $\Delta z_i$ is the focus error for the particular region in at least some of the fields.

6. A method for characterizing focus errors in a photolithography system, the method comprising:
placing a microelectronic substrate onto a substrate support of the photolithography system, the microelectronic substrate being divided into a plurality of fields individually partioned into a plurality of regions;
developing a raw focus error map for the microelectronic substrate on the substrate support, the raw focus error map having a focus error corresponding to the individual regions of the plurality of fields;
deriving at least one of an inter-field focus error map and an intra-field focus error map based on the raw focus error map, the inter-field focus error map having an inter-field focus error corresponding to the individual fields and the intra-field focus error map having an intra-field focus error corresponding to the individual regions, wherein deriving at least one of an inter-field focus error map and an intra-field focus error map includes
deriving the inter-field focus error map by
calculating a first inter-field focus error based on the focus errors of the plurality of regions in a first field;
calculating a second inter-field focus error based on the focus errors of the plurality of regions in a second field; and
developing an inter-field polynomial describing the relationship between the first and second inter-field focus errors; and
deriving the intra-field focus error map by
calculating a first intra-field focus error based on the focus errors of at least some of the fields for the first region;
calculating a second intra-field focus error based on the focus errors of at least some of the fields for the second region; and developing the intra-field polynomial describing the relationship between the first and second intra-field focus errors.

7. The method of claim 6 wherein:
calculating the first inter-field focus error includes calculating a first inter-field arithmetic mean of the focus errors of the plurality of regions in the first field;
calculating the second inter-field focus error includes calculating a second inter-field arithmetic mean of the focus errors of the plurality of regions in the second field;
developing the inter-field polynomial includes developing the inter-field polynomial describing a relationship between the first and second inter-field arithmetic means;
calculating the first intra-field focus error includes calculating a first intra-field arithmetic mean of the focus errors of at least some of the fields for the first region;
calculating the second intra-field focus error includes calculating a second intra-field arithmetic mean of the focus errors of at least some of the fields for the second region; and
developing the intra-field polynomial includes developing the intra-field polynomial describing a relationship between the first and second intra-field arithmetic means.

8. A method for correcting focus errors in a photolithography system, the method comprising:
determining a location of a microelectronic substrate on a substrate support of the photolithography system, the microelectronic substrate being divided into a plurality of fields individually partioned into a plurality of regions; and
compensating for focal errors of the photolithography system based on the determined location of the microelectronic substrate and at least one of an inter-field focus error map having an inter-field focus error corresponding to the individual fields and an intra-field focus error map having an intra-field focus error corresponding to the individual regions in a field, wherein compensating for the focal errors of the photolithography system includes
adjusting the focus of the photolithography system for a first field based on at least one of (1) a first inter-field focus error corresponding to the first field and (2) first intra-field focus errors individually corresponding to at least some regions of the first field, and
adjusting the focus of the photolithography system for a second field based on at least one of (1) a second inter-field focus error corresponding to the second field and (2) second intra-field focus errors individually corresponding to the at least some regions of the second field, the first field being different from the second field, wherein the first inter-field focus error is different from the second inter-field focus error, and wherein the first intra-field focus errors are equal to the corresponding second intra-field focus errors.

9. The method of claim 8 wherein determining the location includes determining which one of the fields is currently positioned to be exposed, and wherein adjusting the focus of the photolithography system includes adjusting the focus of the photolithography system for the determined field based on the inter-field focus error corresponding to the determined field and the intra-field focus errors individually corresponding to at least some of the regions of the determined field.

10. The method of claim 8 wherein determining the location includes determining which one of the fields is currently positioned to be exposed, and wherein adjusting the focus of the photolithography system includes adjusting the focus of the photolithography system based on a focus offset for the substrate support, the inter-field focus error corresponding to the determined field, and the intra-field focus errors individually corresponding to the at least some of the regions of the determined field.

11. A photolithography system, comprising:
   an illumination source configured to provide an illumination;
   a substrate support spaced apart from the illumination source, the substrate support being configured to support a microelectronic substrate divided into a plurality of fields individually partioned into a plurality of regions; and
   a controller operatively coupled to the illumination source, the substrate support, and a reticle, the controller having a computer-readable storage medium containing instructions for performing a process comprising
      compensating for focal errors of the illumination source on the microelectronic substance based on at least one of an inter-field focus error and an intra-field focus error, the inter-field focus error corresponding to the individual fields and the intra-field focus error corresponding to the individual regions in an individual field,
      adjusting the focus of the illumination for a first field based on at least one of (1) a first inter-field focus error corresponding to the first field and (2) first intra-field focus errors individually corresponding to at least some regions of the first field,
      exposing the first field to the illumination from the illumination source,
      positioning a second field to be exposed to the illumination from the illumination source, the second field being different from the first field, and
      adjusting the focus of the photolithography system for the second field based on at least one of (1) a second inter-field focus error corresponding to the second field and (2) second intra-field focus errors individually corresponding to at least some regions of the second field,
   wherein the first inter-field focus error is different than the second inter-field focus error, and wherein the first intra-field focus errors are equal to the corresponding second intra-field focus errors.

12. The photolithography system of claim 11 wherein the first and second inter-field focus errors represent at least in part a focus error for the corresponding first and second fields, and wherein the first and second intra-field focus errors represent at least in part a focus error for the individual regions in the first and second fields, respectively.

13. A photolithography system, comprising:
   an illumination source;
   a reticle having a pattern;
   a substrate support for holding a microelectronic substrate divided into a plurality of fields individually partioned into a plurality of regions, wherein the illumination source is configured to illuminate the individual fields and print a copy of the pattern on the individual fields; and
   means for compensating for focal errors of illumination from the illumination source for the individual fields and for the individual regions in the individual fields, wherein the means include means for moving the substrate support relative to the illumination source and/or the reticle based on an inter-field focus error for the individual fields and an intra-field error for the individual regions in the individual fields, the intra-field error having the same value corresponding to the individual regions for at least some of the fields.

14. The photolithography system of claim 13 wherein the inter-field errors have different values corresponding to at least some of the fields.

* * * * *

UNITED STATES PATENT AND TRADEMARK OFFICE
CERTIFICATE OF CORRECTION

| | | |
|---|---|---|
| PATENT NO. | : 8,203,695 B2 | Page 1 of 1 |
| APPLICATION NO. | : 12/264109 | |
| DATED | : June 19, 2012 | |
| INVENTOR(S) | : Woong Jae Chung | |

It is certified that error appears in the above-identified patent and that said Letters Patent is hereby corrected as shown below:

In column 13, line 20, in Claim 11, delete "illumination source" and insert -- illumination from the illumination source --, therefor.

In column 13, line 21, in Claim 11, delete "substance" and insert -- substrate --, therefor.

Signed and Sealed this
Fourth Day of September, 2012

David J. Kappos
*Director of the United States Patent and Trademark Office*